(12) United States Patent
Im

(10) Patent No.: US 7,358,144 B2
(45) Date of Patent: Apr. 15, 2008

(54) METHOD FOR FABRICATING SEMICONDUCTOR DEVICE

(75) Inventor: Song Hyeuk Im, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 117 days.

(21) Appl. No.: 11/279,164

(22) Filed: Apr. 10, 2006

(65) Prior Publication Data

US 2007/0173015 A1    Jul. 26, 2007

(30) Foreign Application Priority Data

Jan. 23, 2006   (KR) .................... 10-2006-0006969

(51) Int. Cl.
*H01L 21/336* (2006.01)

(52) U.S. Cl. .............. 438/296; 438/429; 438/430; 438/435; 257/E21.429

(58) Field of Classification Search ............ 438/296, 438/429, 430, 435; 257/E21.428, E21.429
See application file for complete search history.

(56) References Cited

U.S. PATENT DOCUMENTS

| | | | | |
|---|---|---|---|---|
| 5,099,304 | A * | 3/1992 | Takemura et al. | 257/647 |
| 6,150,219 | A * | 11/2000 | Tung | 438/270 |
| 6,593,207 | B2 * | 7/2003 | Hong et al. | 438/424 |
| 6,696,349 | B2 * | 2/2004 | Vollrath et al. | 438/430 |
| 6,955,972 | B2 * | 10/2005 | Lee et al. | 438/430 |
| 7,081,398 | B2 * | 7/2006 | Trivedi | 438/430 |
| 7,217,623 | B2 * | 5/2007 | Kim et al. | 438/283 |
| 2004/0195608 | A1 * | 10/2004 | Kim et al. | 257/296 |
| 2007/0176245 | A1 * | 8/2007 | Kim et al. | 257/401 |

FOREIGN PATENT DOCUMENTS

| KR | 10-2005-0079270 A | 8/2005 |
|---|---|---|
| KR | 10-2006-0001190 A | 1/2006 |

* cited by examiner

*Primary Examiner*—Lex Malsawma
(74) *Attorney, Agent, or Firm*—Townsend and Townsend and Crew LLP

(57) ABSTRACT

A method for fabricating a semiconductor device includes forming first, second, and third device structures in a semiconductor substrate. Each device structure includes a first film, a second film over the first film, and a third film over the second film. The first and third device structures are device isolation structures. A portion of the second device structure is etched to define a bit line contact region, the bit line contact region extending from an upper surface of the second device structure to a lower surface of the second device structure. The second film of the second device structure is etched to define an under-cut space between the first and second films. A semiconductor layer is formed within the under-cut space and the bit line contact region. The third film of the second device structure is etched or removed to define a recess, the recess defining a gate region. A gate structure is formed at least partly within the recess.

17 Claims, 7 Drawing Sheets

METHOD FOR FABRICATING SEMICONDUCTOR DEVICE

BACKGROUND OF THE INVENTION

The present invention relates to method for fabricating a memory device. In particular, the present invention relates to a method for fabricating a semiconductor device wherein a buried insulating film is formed under a gate to form a SOI (Silicon-on-Insulator) channel region, thereby reducing a short channel effect and junction leakage current of the device.

FIGS. 1a through 1e are simplified cross-sectional views illustrating a conventional method for fabricating a semiconductor device.

Referring to FIG. 1a, a pad oxide film 13 and a pad nitride film 15 are formed over a semiconductor substrate 10. The pad nitride film 15, the pad oxide film 13 and the semiconductor substrate 10 are etched by a predetermined thickness to form a trench 20.

Referring to FIGS. 1b and 1c, an insulating film for device isolation (not shown) filling up the trench 20 is formed. Next, the insulating film for device isolation is polished until the pad nitride film 15 is exposed to form a device isolation structure 30 defining an active region. Thereafter, the pad nitride film 15 is removed.

Referring to FIGS. 1d and 1e, a process for implanting impurity ions 33 is performed on the entire surface to form a well and channel ion implantation region (not shown) in the semiconductor substrate 10. The pad oxide film 13 is removed to expose the semiconductor substrate 10. Next, a gate insulating film 60 is formed over the exposed semiconductor substrate 10. A gate conductive layer (not shown) and a hard mask layer (not shown) are formed over the entire surface of the resultant. Thereafter, the hard mask layer and the gate conductive layer are etched using a gate mask (not shown) to form a gate 90 having a stacked structure of a gate electrode 70 and a hard mask layer pattern 80.

According to the above method for fabricating a semiconductor device, it is difficult to lower a threshold voltage because the channel length is decreased according the shrunk design rule. Since the width between the gates is decreased, a short channel effect is also advanced. In particular, as voltage of a drain region is increased, the electrical potential barrier at a source region is lowered due to interaction of the drain region with the active region, thereby increasing DIBL (Drain Induced Barrier Lowering) effect. Accordingly, the gate voltage cannot control the drain voltage, and in a worse case their depletion regions are encountered. As a result, electrons are driven toward the drain region due to high electric field between the source region and the drain region. In order to maintain threshold voltage of the device according to the decreased width of the gate, ion-doped concentration of the channel region is increased. For controlling a "punch-through" phenomena, impurity ions are implanted in the channel region to relatively increase the electric field of the junction region. Accordingly, the refresh character of the device is degraded.

BRIEF SUMMARY OF THE INVENTION

According to the present invention, techniques for a method for fabricating a memory device are provided. In particular, the present invention provides a method for fabricating a semiconductor device wherein in order to improve a punch-through effect, an electric field effect and a channel length body effect is decreased due to the shrunk design rule, wherein a buried insulating film is formed under a gate to form a SOI (Silicon-on-Insulator) channel region, thereby reducing a short channel effect and junction leakage current of the device.

In one embodiment of the present invention, a method for fabricating a semiconductor device includes: (a) forming a device isolation structure in a semiconductor substrate having a pad insulating film to define a storage node contact region, wherein the device isolation structure includes a stacked structure of a first oxide film, a nitride film and a second oxide film; (b) removing the device isolation structure of a bit line contact region to expose the semiconductor substrate; (c) etching the pad insulating film and the nitride film exposed in the bit line contact region to form an under-cut space for gate channel in the device isolation structure which is adjacent to the bit line contact region; (d) forming a Selective Epitaxial Growth ("SEG") layer using the exposed semiconductor substrate as a seed layer, wherein the SEG layer fills up the bit line contact region and the under-cut space for gate channel; (e) removing the second oxide film of a gate region next to the bit line contact region to form a recess; (f) forming a gate insulating film on the surface of the recess; (g) forming a planarized gate conductive layer on the entire surface of the resultant, wherein the gate conductive layer substantially fills up the recess; (h) forming a hard mask layer over the gate conductive layer; and (i) patterning the hard mask layer and the gate conductive layer using a gate mask to form a gate.

A method for fabricating a semiconductor device includes forming first, second, and third device structures in a semiconductor substrate. Each device structure includes a first film, a second film over the first film, and a third film over the second film. The first and third device structures are device isolation structures. A portion of the second device structure is etched to define a bit line contact region, the bit line contact region extending from an upper surface of the second device structure to a lower surface of the second device structure. The second film of the second device structure is etched to define an under-cut space between the first and second films. A semiconductor layer is formed within the under-cut space and the bit line contact region. The third film of the second device structure is etched or removed to define a recess, the recess defining a gate region. A gate structure is formed at least partly within the recess. The first, second, and third films are oxide film, nitride film, and oxide film, respectively.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

FIGS. 2a through 2h are simplified cross-sectional views illustrating a method for fabricating a semiconductor substrate in accordance with an embodiment of the present invention.

Figure 1A:
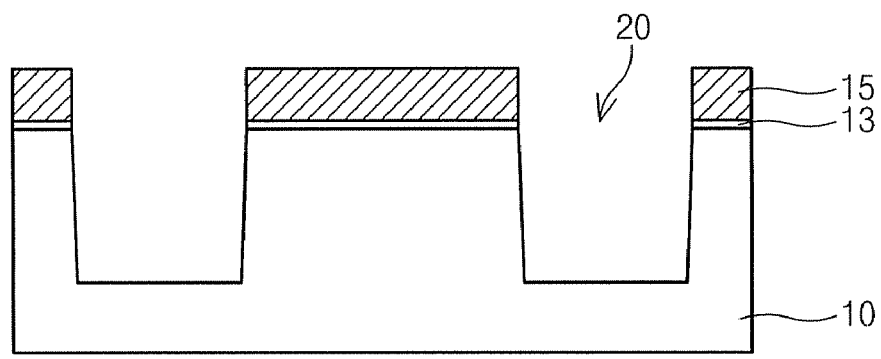
FIGS. 1a through 1e are simplified cross-sectional views illustrating a conventional method for fabricating a semiconductor device.
Figure 1B:
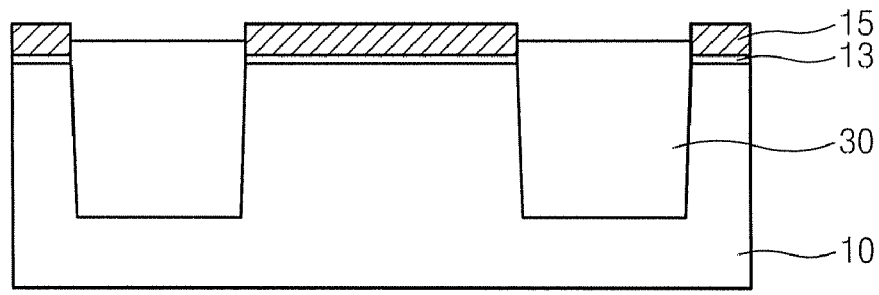
Figure 1C:
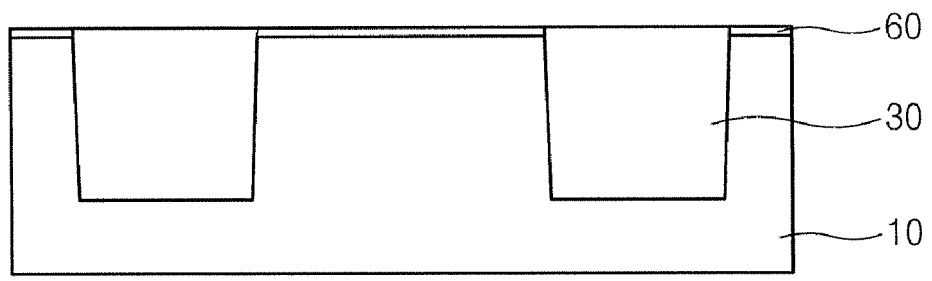
Figure 1D:
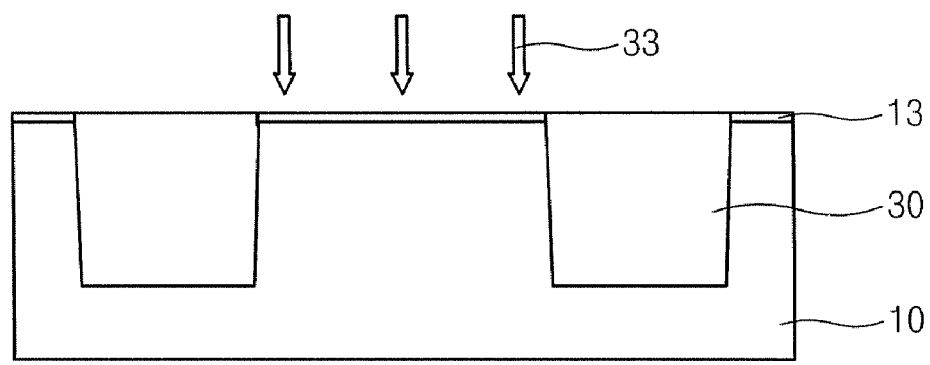
Figure 1E:
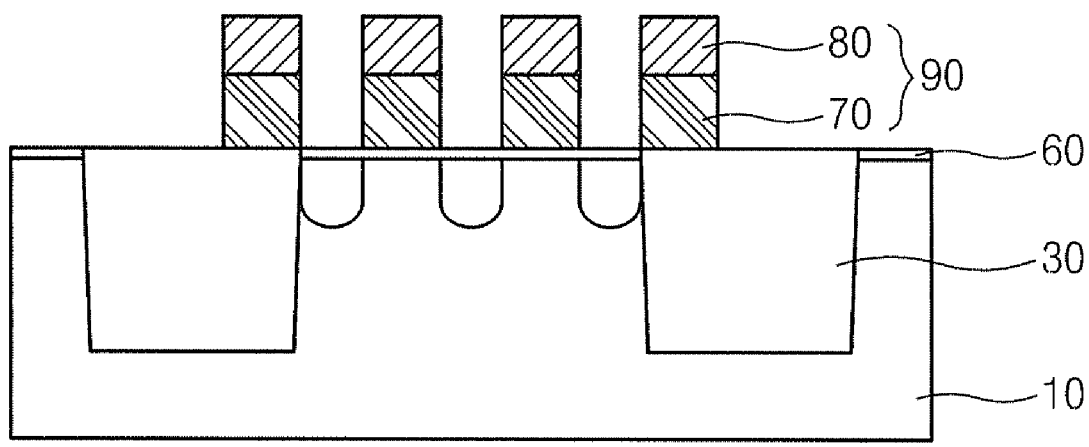
Figure 2A:
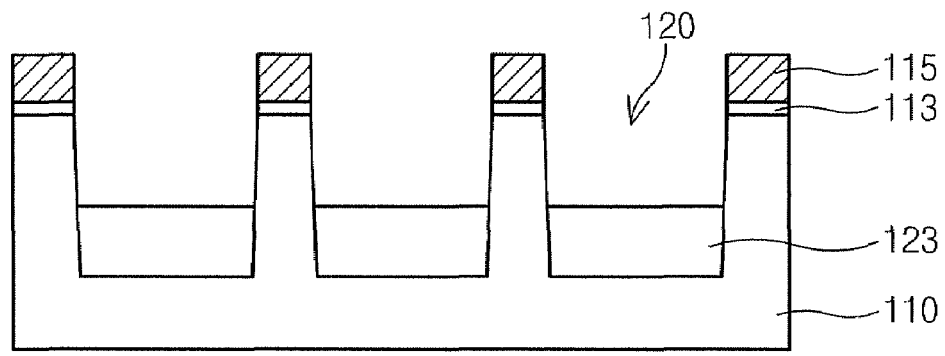
FIGS. 2a through 2h are simplified cross-sectional views illustrating a method for fabricating a semiconductor device in accordance with an embodiment of the present invention.

Referring to FIG. 2a, a pad oxide film 113 and a pad nitride film 115 are formed on a semiconductor substrate 110. Next, a photoresist film (not shown) is formed over the pad nitride film 115, and then exposed and developed using a storage node contact mask (not shown) to form a photoresist film pattern (not shown) defining a storage node contact region. Thereafter, the pad nitride film 115, the pad oxide film 113 and the semiconductor substrate 110 are etched using the photoresist film pattern as an etching mask by a predetermined thickness to form a trench 120 where the semiconductor substrate 110 of a bit line contact region and its neighboring gate regions is etched. The photoresist film pattern is then removed. After that, a first oxide film 123 is formed on the entire surface of the resultant. The first oxide film 123 is etched to remove the first oxide film 123 at the sidewalls of the trench 120. In some embodiments, the predetermined thickness of the etched semiconductor substrate 110 ranges from about 2500 A to about 3500 A during the process of forming the trench 120. In some embodiments, the etching process for the first oxide film 123 is performed by an isotropic dry or wet etching method. In some embodiments, the thickness of the first oxide film 123 ranges from about 1000 A to about 2000 A.

Figure 2B:
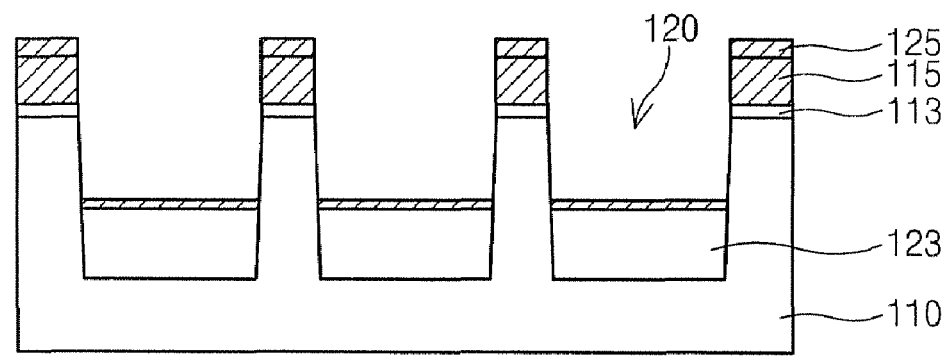
Figure 2C:
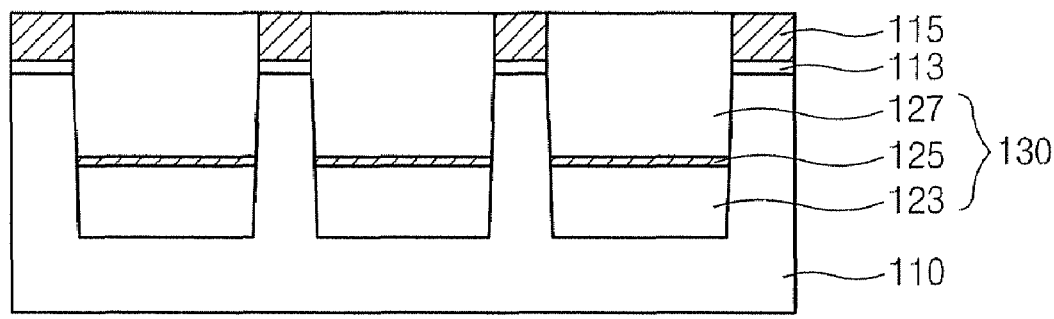

Referring to FIGS. 2b and 2c, a nitride film 125 is formed on the entire surface of the resultant, and then etched to remove the nitride film 125 at the sidewalls of the trench 120. Next, a second oxide film 127 filling up the trench 120 is formed on the entire surface of the resultant, and then planarized until the pad nitride film 115 is exposed to form a device isolation structure 130. Here, the device isolation structure 130 includes a stacked structure of the first oxide film 123, the nitride film 125, and the second oxide film 127. In some embodiments, the nitride film 125 is a PE-nitride film, wherein the thickness of the nitride film 125 at the sidewalls of the trench 120 is less than that of the nitride film 125 over the first oxide film 123. In some embodiments, the etching process for the nitride film 125 is performed by an isotropic etching method or an etch-back method. In some embodiments, the thickness of the nitride film 125 in the trench 120 ranges from about 50 A to about 150 A. Further, in some embodiments, the planarizing process of the device isolation structure 130 is performed by half thickness of the pad nitride film 115.

Figure 2D:
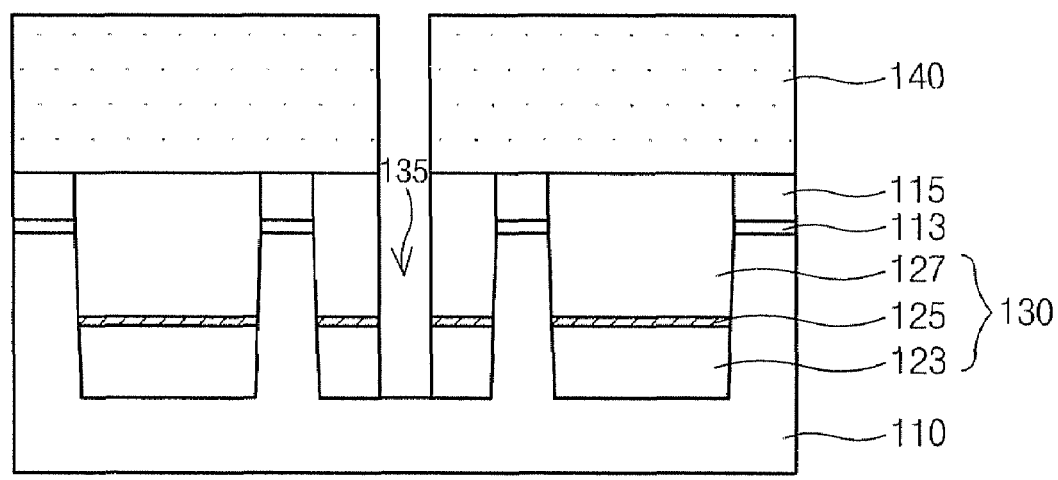

Referring to FIG. 2d, a photoresist film (not shown) is formed on the entire surface of the resultant, and then exposed and developed using a bit line contact mask to form a photoresist film pattern 140 defining a bit line contact region 135. Next, the device isolation structure 130 of the bit line contact region 135 is etched using the photoresist film pattern 140 as an etching mask to expose the semiconductor substrate 110 at the bottom of the bit line contact region 135. In some embodiments, the removing process for the device isolation structure 130 is performed by a dry etching method.

Figure 2E:
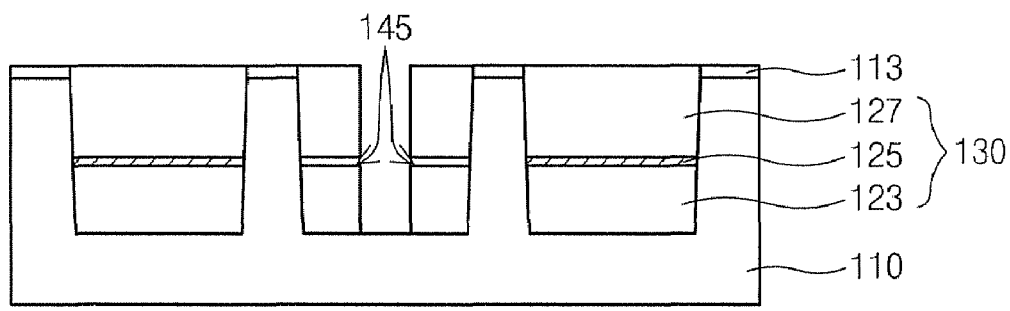

Referring to FIG. 2e, the photoresist film 140 is removed. The pad nitride film 115 and the nitride film 125 exposed in the bit line contact region 135 shown in FIG. 2d are then removed to form an under-cut space for gate channel region 145 in the device isolation structure next to the bit line contact region 135. In some embodiments, the removing process for the pad nitride film 115 and the nitride film 125 is performed by a wet etching process using $H_3PO_4$.

Figure 2F:
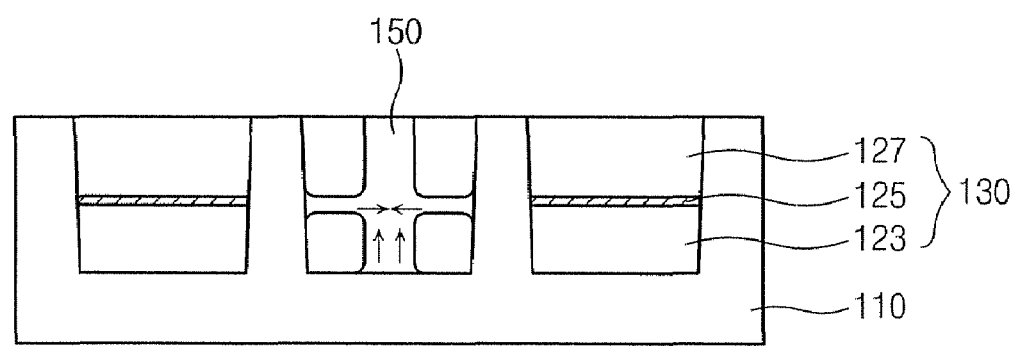

Referring to FIG. 2f, the pad oxide film 113 is removed. A cleaning process using HF is then subjected to the bit line contact region 135 shown in FIG. 2d to make the edges of the first oxide film 123 and the second oxide film 127 in the under-cut space 145 for gate channel region rounded. Next, a Selective Epitaxial Growth ("SEG") layer 150 is formed using the semiconductor substrate 110 exposed in the bit line contact region and the under-cut space 145 for gate channel region to fill up the bit line contact region and the under-cut space 145 for gate channel region. The SEG layer 150 is formed using the exposed semiconductor substrate 110 as a seed layer. Thereafter, the SEG layer 150 is planarized until the top surface of the device isolation structure 130 is exposed.

Figure 2G:
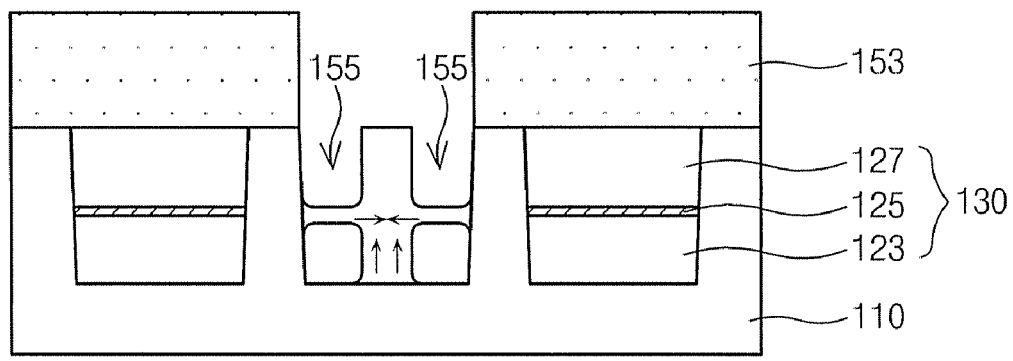

Referring to FIG. 2g, a photoresist film (not shown) is formed on the entire surface of the resultant, and then exposed and developed to form a photoresist film pattern 153 exposing the SEG layer 150 in the bit line contact region and its neighboring second oxide films 127. Next, the exposed second oxide films 127 are selectively removed to form a recess 155. In some embodiments, the removing process for the second oxide film 127 is performed by a wet etching method.

Figure 2H:
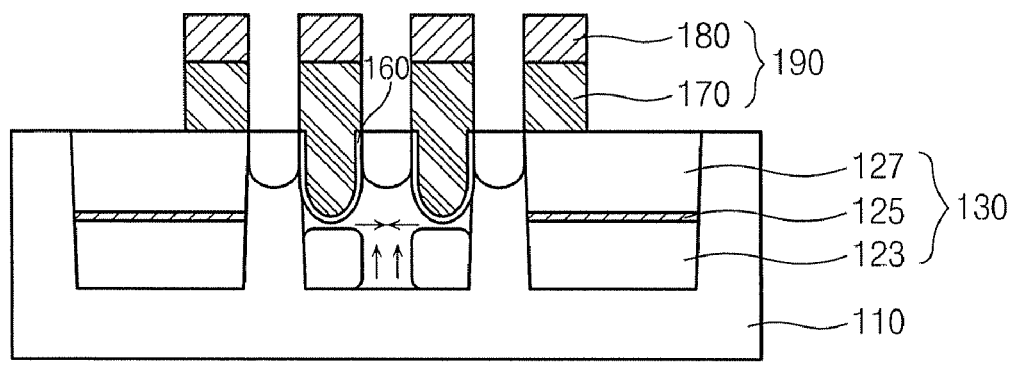

Referring to FIG. 2h, the photoresist film pattern 153 is removed. A gate insulating film 160 is then formed over the surface of the recess 155. Next, a planarized gate conductive layer (not shown) filling the recess 155 is formed on the entire surface of the resultant. A hard mask layer (not shown) is then formed over the gate conductive layer. Thereafter, the hard mask layer and the gate conductive layer are patterned using a gate mask (not shown) to form a gate 190 including a stacked structure of a gate electrode 170 and a hard mask layer pattern 180. At this time, the gate 190 is formed over a Silicon-on-Insulator ("SOI") channel region where the SEG layer 150 is formed over the buried first oxide film 123.

In accordance with another embodiment of the present invention, a planar gate instead of a recessed gate can be formed over the SOI channel region where a silicon layer is formed over the buried oxide film.

In addition, subsequent processes such as a process for forming a spacer on a sidewall of the gate, an ion-implantation process for forming source/drain regions in the active regions, a process for forming a landing plug, a process for forming a bit line contact and a bit line, a process for forming a capacitor and a process for forming an interconnect may be performed.

As described above, the method for fabricating a semiconductor substrate in accordance with an embodiment of the present invention provides forming a buried insulating film under a gate to form a SOI channel region, thereby reducing a Drain Induced Barrier Lowering (DIBL) effect caused by an increased width of a depletion layer and preventing leakage current due to capacitance of threshold voltage. Accordingly, a punch-through phenomenon of the device can be effectively reduced.

In addition, since the device has the SOI channel region, the Short Channel Effect ("SCE") such as a punch-through phenomenon is prevented. Accordingly, refresh characteristics of the device can be improved. Due to the SOI channel region, the body effect of the device is improved to form a shallow junction region.

It will be appreciated that the method described above is illustrative and other variations and modifications are possible. Order of steps may be varied, and steps may be modified or combined.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, the method comprising:
    (a) forming a device isolation structure in a semiconductor substrate having a pad insulating film to define a storage node contact region, wherein the device isolation structure includes a stacked structure of a first oxide film, a nitride film, and a second oxide film;
    (b) etching a portion of the device isolation structure to define a bit line contact region and expose the semiconductor substrate;
    (c) etching the nitride film exposed in the bit line contact region to form an under-cut space for a gate channel in the device isolation structure which is adjacent to the bit line contact region;
    (d) forming a Selective Epitaxial Growth ("SEG") layer using the exposed semiconductor substrate as a seed layer, wherein the SEG layer fills the bit line contact region and the under-cut space;
    (e) removing the second oxide film of the device isolation structure to define a recess, the recess defining a gate region;
    (f) forming a gate insulating film within the recess;
    (g) forming a gate conductive layer over the gate insulating film, the gate conductive layer substantially filling the recess;
    (h) providing a patterned hard mask layer over the gate conductive layer; and
    (i) patterning the gate conductive layer using the patterned hard mask layer to form a gate structure.

2. The method according to claim 1, wherein step (a) further includes:
    (a-1) etching a predetermined thickness of a semiconductor substrate having the pad insulating film using a storage node contact mask to form a trench defining a storage node contact region, the trench having a first depth from an upper surface of the substrate;
    (a-2) forming the first oxide film over and within the trench;
    (a-3) etching the first oxide film, so that an upper surface of the first oxide film is aligned to a second depth from the upper surface of the substrate, the second depth being less than the first depth;
    (a-4) forming the nitride film over the first oxide film and within the trench;
    (a-5) etching the nitride film to remove the nitride film, so that an upper surface of the nitride film is aligned to a third depth from the upper surface of the substrate, the third depth being less than the second depth;
    (a-6) forming the second oxide film over the nitride film, the second oxide film at least substantially filling the trench; and
    (a-7) removing a portion of the second oxide film that resides outside of the trench to form the device isolation structure.

3. The method according to claim 2, wherein the predetermined thickness of the etched semiconductor substrate ranges from about 2500 A to about 3500 A.

4. The method according to claim 2, wherein the etching process for the first oxide film is performed by an isotropic dry or wet etching method.

5. The method according to claim 2, wherein the etching process for the nitride film is performed by an isotropic etching method or an etch-back method.

6. The method according to claim 1, wherein the thickness of the first oxide film and the second oxide film ranges from about 1000 A to about 2000 A.

7. The method according to claim 1, wherein the nitride film is a PE-nitride film ranging from about 50 A to about 150 A.

8. The method according to claim 1, wherein the removing process for the device isolation structure in the bit line contact region is performed by a dry etching method.

9. The method according to claim 1, wherein the nitride film is etched using a wet etching method using $H_3PO_4$.

10. The method according to claim 1, the method further comprising cleaning the under-cut space by using HF.

11. The method according to claim 1, the method further comprising planarizing the SEG layer until the top surface of the device isolation structure is exposed.

12. The method according to claim 1, wherein the removing process for the second oxide film is performed by a wet etching process.

13. A method for fabricating a semiconductor device, the method comprising:
    forming first, second, and third device structures in a semiconductor substrate, each device structure including a first film, a second film over the first film, and a third film over the second film, the first and third device structures being device isolation structures;
    etching a portion of the second device structure to define a bit line contact region, the bit line contact region extending from an upper surface of the second device structure to a lower surface of the second device structure;
    etching the second film of the second device structure to define an under-cut space between the first and second films;
    forming a semiconductor layer within the under-cut space and the bit line contact region;
    removing the third film of the second device structure to define a recess, the recess defining a gate region; and
    forming a gate structure at least partly within the recess.

14. The method of claim 13, wherein the first, second, and third films are oxide film, nitride film, and oxide film, respectively.

15. The method of claim 13, wherein the etching of the portion of the second device structure to define the bit line contact region exposes a portion of the semiconductor substrate.

16. The method of claim 15, wherein the semiconductor layer is formed using a Selective Epitaxial Growth ("SEG") layer, the SEG layer being formed using the exposed portion of the semiconductor substrate.

17. The method of claim 13, wherein at least the second and third films are different films.

* * * * *